United States Patent
Teng

(10) Patent No.: US 6,541,183 B2
(45) Date of Patent: Apr. 1, 2003

(54) NEGATIVE LITHOGRAPHIC PRINTING PLATES HAVING A SEMISOLID RADIATION-SENSITIVE LAYER

(76) Inventor: Gary Ganghui Teng, 10 Kendall Dr., Nothborough, MA (US) 01532

( * ) Notice: Subject to any disclaimer, the term of this patent is extended or adjusted under 35 U.S.C. 154(b) by 0 days.

(21) Appl. No.: 09/873,598

(22) Filed: Jun. 4, 2001

(65) Prior Publication Data

US 2003/0036019 A1 Feb. 20, 2003

(51) Int. Cl.[7] .............................. G03F 7/30; G03F 7/38; G03F 7/11
(52) U.S. Cl. ....................... 430/303; 430/302; 430/944; 430/327; 430/273.1
(58) Field of Search .................................. 430/302, 303

(56) References Cited

U.S. PATENT DOCUMENTS

| | | | | |
|---|---|---|---|---|
| 3,573,975 A | * | 4/1971 | Dhaka et al. ................ | 430/327 |
| 3,669,667 A | * | 6/1972 | Skarvinko ................... | 430/327 |
| 4,054,094 A | | 10/1977 | Caddell et al. ............. | 101/467 |
| 4,063,949 A | | 12/1977 | Uhlig et al. ................ | 96/27 E |
| 4,248,959 A | | 2/1981 | Jeffers et al. .............. | 430/300 |
| 4,486,529 A | | 12/1984 | Jeffers et al. .............. | 430/300 |
| 5,379,698 A | | 1/1995 | Nowak et al. .............. | 101/454 |
| 5,491,046 A | | 2/1996 | DeBoer et al. ............. | 430/302 |
| 5,616,449 A | | 4/1997 | Cheng et al. ............... | 430/302 |
| 5,674,658 A | | 10/1997 | Burbery et al. ............. | 430/262 |
| 5,677,106 A | | 10/1997 | Burbery et al. ............. | 430/253 |
| 5,677,110 A | | 10/1997 | Chia et al. .................. | 430/302 |
| 5,705,309 A | | 1/1998 | West et al. ................. | 430/167 |
| 5,955,238 A | | 9/1999 | Yokoya et al. ............. | 430/166 |
| 6,014,929 A | | 1/2000 | Teng .......................... | 101/456 |
| 6,117,610 A | | 1/2000 | Sheriff et al. .............. | 430/190 |
| 6,071,675 A | | 6/2000 | Teng .......................... | 430/302 |

* cited by examiner

*Primary Examiner*—Cynthia Hamilton

(57) ABSTRACT

This patent describes a lithographic printing plate comprising on a substrate a semisolid radiation-sensitive layer capable of hardening upon exposure to a suitable radiation, and a method of imaging such a plate using laser radiation. The utilization of a semisolid radiation-sensitive layer allows faster photospeed and better curing efficiency as desired for digital laser exposure. Several plate designs can be utilized to overcome the tackiness issue associate with the semisolid layer, such as conformally coating the radiation-sensitive layer on a rough substrate and utilizing an overcoat. Plates having an ink and/or fountain solution or dispersible semisolid radiation-sensitive layer can be directly developed with ink and/or fountain solution while solution while mounted on press, with the imagewise laser exposure being carried out on press or off press.

40 Claims, No Drawings

NEGATIVE LITHOGRAPHIC PRINTING PLATES HAVING A SEMISOLID RADIATION-SENSITIVE LAYER

FIELD OF THE INVENTION

This invention relates to lithographic printing plates. More specifically, it relates to lithographic plates comprising on a substrate a semisolid radiation-sensitive layer suitable for imaging with a laser according to digital imaging information.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

Lithographic printing can be further divided into two general types: wet lithographic printing (conventional lithographic printing) and waterless lithographic printing. In wet lithographic printing plates, the ink-receptive areas consist of oleophilic materials and the ink-repelling areas consist of hydrophilic materials; fountain solution (consisting of primarily water) is required to continuously dampen the hydrophilic materials during printing operation to make the non-image areas oleophobic (ink-repelling). In waterless lithographic printing plates, the ink-receptive areas consist of oleophilic materials and the ink-repelling areas consist of oleophobic materials; no dampening with fountain solution is required.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties (such as hydrophilic vs. oleophilic, and oleophobic vs. oleophilic). The photosensitive coating is usually a photosensitive material, which solubilizes or hardens upon exposure to an actinic radiation, optionally with further post-exposure overall treatment. Here, hardening means becoming insoluble in a certain developer. In positive-working systems, the exposed areas become more soluble and can be developed to reveal the underneath substrate. In negative-working systems, the exposed areas become hardened and the non-exposed areas can be developed to reveal the underneath substrate. The exposed plate is usually developed with a liquid developer to bare the substrate in the non-hardened or solubilized areas.

On-press developable lithographic printing plates have been disclosed in the literature. Such plates can be directly mounted on press after exposure to develop with ink and/or fountain solution during the initial press operation and then to print out regular printed sheets. No separate development process before mounting on press is needed. Among the patents describing on-press developable lithographic printing plates are U.S. Pat. Nos. 5,258,263, 5,516,620, 5,561,029, 5,616,449, 5,677,110, 5,811,220, 6,014,929, and 6,071,675.

Conventionally, the plate is exposed with an actinic light (usually an ultraviolet light from a lamp) through a separate photomask film having predetermined image pattern which is placed between the light source and the plate. While capable of providing plate with superior lithographic quality, such a method is cumbersome and labor intensive.

Laser sources have been increasingly used to imagewise expose a printing plate that is sensitized to a corresponding laser wavelength. This allows the elimination of the photomask film, reducing material, equipment and labor cost.

Among the laser imagable plates are plates sensitive to infrared laser (such as from infrared laser diode at about 830 nm and Nd/YAG laser at about 1064 nm), HeNe laser (about 633 nm), frequency-doubled Nd/YAG laser (about 532 nm), argon ion laser (about 488 nm), violet diode laser (about 410 nm), and ultraviolet gas laser (about 365 nm). Infrared laser sensitive plates are also called thermosensitive plates or thermal plates because the infrared laser is generally converted to heat to cause a certain chemical or physical change (such as hardening, solubilization, ablation, phase change, or thermal flow) needed for imaging formation on a plate, although sensitization of the initiator by the infrared dye through charge transfer may also play a role in some thermosensitive plates.

Various laser imagable plates have been disclosed in the patent literature. Examples of laser imagable plates are described in U.S. Pat. Nos. 4,054,094 and 5,379,698 (laser ablation plates), U.S. Pat. Nos. 5,705,309, 5,674,658 and 5,677,106 (negative thermosensitive plates), U.S. Pat. Nos. 5,491,046 and 6,117,610 (both positive and negative thermosensitive plates, depending on the process), U.S. Pat. No. 5,919,600 and 5,955,238 (thermosensitive positive waterless plate), U.S. Pat. No. 4,063,949 (negative plate imagable with a laser, such as argon ion laser and $CO_2$ laser), and U.S. Pat. No. 4,486,529 and 4,248,959 (visible laser sensitive negative plate comprising a para-aminobenzene diazonium compound).

Despite the progress in digital laser imagable plates, the current laser imagable photopolymer plates have relatively low photospeed which limits the imaging throughput. For examples, the current thermal plate imagers are often equipped with many (such as 15) laser diodes in order to meet the throughput requirement; such a multiple laser design is very expensive and complex. For violet and other visible laser imagable plates, there has been a challenge in achieving sufficient photospeed. Therefore, there is a need for a laser imagable photopolymer lithographic plate (wet or waterless plate) with significantly improved photospeed.

I have found that laser imagable negative lithographic plates having a semisolid radiation-sensitive layer can have significantly improved photospeed over plates having a solid radiation-sensitive layer of similar composition. Such plates allow laser imaging at more desirable photospeeds. The use of semisolid radiation-sensitive layer in laser imagable negative lithographic plates is unexpected because traditionally the radiation-sensitive layer of lithographic plates is formulated as a solid coating in order to avoid handling problems such as tackiness, finger printing, and blocking. However, I have also found that the tackiness, finger printing, and blocking problems associated with a semisolid radiation-sensitive layer can be eliminated or reduced by various plate designs such as coating the radiation-sensitive layer on a rough substrate in a conformal configuration as described in U.S. patent application Ser. No. 05/609,018, utilizing a thick overcoat, utilizing a transparent cover sheet, and utilizing a non-sticky interleaf.

SUMMARY OF THE INVENTION

It is an object of this invention to provide a negative lithographic plate (wet or waterless plate) with fast photospeed suitable for imaging with an infrared laser, visible laser (including violet laser), or ultraviolet laser.

It is another object of this invention to provide a laser imagable negative lithographic plate comprising on a substrate a semisolid radiation-sensitive layer capable of hardening upon exposure to an infrared laser, visible laser, or ultraviolet laser.

It is another object of this invention to provide a laser imagable negative waterless lithographic plate comprising on an oleophilic substrate a semisolid radiation-sensitive layer and a top oleophobic layer, said radiation-sensitive layer being capable of hardening upon exposure to an infrared laser, visible laser, or ultraviolet laser.

It is another object of this invention to provide an on-press ink and/or fountain solution developable, laser imagable lithographic plate comprising on a substrate a semisolid radiation-sensitive layer, with or without a top oleophobic layer.

It is another object of this invention to provide a method of on-press developing an ink and/or fountain solution developable, laser imagable lithographic plate comprising on a substrate a semisolid radiation-sensitive layer, with or without a top oleophobic layer.

It is yet another object of this invention to provide a method of on-press imaging and developing a laser imagable lithographic plate comprising on a substrate a semisolid radiation-sensitive layer, with or without a top oleophobic layer.

Further objects, features and advantages of the present invention will become apparent from the detailed description of the preferred embodiments.

According to the present invention, there has been provided a lithographic printing plate comprising on a substrate a semisolid radiation-sensitive layer capable of hardening upon exposure to a radiation in the infrared and visible region; said radiation-sensitive layer exhibiting an affinity or aversion substantially opposite to the affinity or aversion of said substrate to at least one printing liquid selected from the group consisting of ink and an adhesive fluid for ink.

According to another aspect of the present invention, there has been provided a lithographic printing plate comprising on an oleophilic substrate (i) a semisolid radiation-sensitive layer capable of hardening upon exposure to a radiation in the infrared, visible, or ultraviolet region; and (ii) an oleophobic top layer.

According to another aspect of the present invention, there has been provided a method of imaging a lithographic plate, comprising in order: (a) providing a lithographic plate comprising on a substrate a semisolid radiation-sensitive layer capable of hardening upon exposure to an infrared laser, visible laser (including violet laser), or ultraviolet laser; said radiation-sensitive layer exhibiting an affinity or aversion substantially opposite to the affinity or aversion of said substrate to at least one printing liquid selected from the group consisting of ink and an adhesive fluid for ink; and (b) imagewise exposing the plate with the suitable laser to cause hardening of the radiation-sensitive layer in the exposed areas.

According to another aspect of the present invention, there has been provided a method of imaging a lithographic plate, comprising in order: (a) providing a lithographic plate comprising on an oleophilic substraw (i) a semisolid radiation-sensitive layer capable of hardening upon exposure to an infrared laser, visible laser, or ultraviolet laser; and (ii) an oleophobic top layer; and (b) imagewise exposing the plate with the suitable laser to cause hardening of the radiation-sensitive layer in the exposed areas.

The exposed plate can be developed with a suitable developer to remove the radiation-sensitive layer (or the radiation-sensitive layer and the top oleophobic layer).

For a plate having an on-press ink and/or fountain solution developable radiation-sensitive layer, the developer can be ink and/or fountain solution. The plate can be developed on a lithographic printing press by contacting with ink (for waterless plate) or with ink and/or fountain solution (for wet plate) by rotating the plate cylinder and engaging ink and/or fountain solution roller. The developed plate can then directly print images to the receiving sheets (such as papers). The plate can be imagewise exposed with a laser on a plate exposure device and then transferred to a lithographic press for on-press development with ink and/or fountain solution. Alternatively, the plate can be imagewise exposed with a laser while mounted on a plate cylinder of a lithographic press, on-press developed on the same plate cylinder with ink and/or fountain solution, and then directly print images to the receiving sheets.

DETAILED DESCRIPTION OF THE PREFERRED EMBODIMENTS

The substrate employed in the lithographic plates of this invention can be any lithographic support. Such a substrate may be a metal sheet, a polymer film, or a coated paper. Aluminum (including aluminum alloys) sheet is a preferred metal support. Particularly preferred is an aluminum support that has been grained, anodized, and deposited with a barrier layer. Polyester film is a preferred polymeric film support. A surface coating may be coated to achieve desired surface properties. For wet plate, the substrate should have a hydrophilic or oleophilic surface, depending on the surface properties of the radiation-sensitive layer; commonly, a wet lithographic plate has a hydrophilic substrate and an oleophilic radiation-sensitive layer. For waterless plate, the substrate should have an oleophilic or oleophobic surface, depending on the surface properties of the radiation-sensitive layer.

Particularly preferred hydrophilic substrate for a wet lithographic plate is an aluminum support which has been grained, anodized, and deposited with a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153,461, 4,399,021, and 5,368,974. Suitable polymer film supports for a wet lithographic plate include a polymer film coated with a hydrophilic layer, preferably a hydrophilic layer which is crosslinked, as described in U.S. Pat. No. 5,922,502.

For preparing a plate having the radiation-sensitive layer conformally coated on a roughened substrate as described in U.S. patent application Ser. No. 05/609,018, the substrate should have roughened surface. Here the roughened surface is defined as a surface having microscopic, non-smooth structures on the whole surface (for the roughened side). Such microscopic structures include regular or irregular peaks, valleys, pores, and holes. Such a support may be a metal sheet, a polymer film, or a coated paper. Mechanically, chemically or electrochemically grained and anodized aluminum substrates are preferred metal substrates.

The radiation-sensitive layer of the current invention can be any semisolid material capable of hardening upon exposure to a suitable radiation in the infrared, visible, or ultraviolet region. Here the term semisolid material (or semisolid layer) is defined as a material which, when coated on a flat and smooth surface at a thickness of at least 1 micron, is able to form fingerprints when pressed with a finger at a force (or weight) of 2 kg and is tacky to touch by fingers. Hardening means becoming insoluble in a suitable developer; for on-press developable plate, hardening means becoming insoluble in ink and/or fountain solution. In this patent, hardening is preferably achieved through crosslinking or polymerization of the monomer or oligomer through free radical or cationic polymerization. The radiation-sensitive layer preferably has a coverage of from 100 to 5000 mg/m$^2$, and more preferably from 400 to 2000 mg/m$^2$.

The radiation-sensitive layer suitable for the current invention may be formulated from various polymerizable materials with suitable radiation-sensitive initiator, optionally with addition of sensitizer and coinitiator. For infrared laser sensitive plate, an infrared absorbing dye or pigment is usually added to allow light-to-heat conversion. Infrared dye is preferred infrared absorber which may also act as a sensitizer. The radiation-sensitive layer of this invention generally has higher liquid content in order to be semisolid. For example, higher monomer-to-polymer ratios are generally utilized. Various additives useful for conventional radiation-sensitive layer can also be used, including pigment, dye, exposure indicator, and stabilizer.

Thermosensitive materials useful for negative wet lithographic plates of this invention include, for example, semisolid thermosensitive compositions comprising a crosslinkable monomer or oligomer, a thermosensitive initiator, an infrared light absorbing dye or pigment, and optionally a polymer. Such thermosensitive materials are also useful as the radiation-sensitive layer for plates having a top oleophobic layer.

Thermosensitive oleophobic materials useful as oleophobic radiation-sensitive layer in waterless plates of this invention include, for example, semisolid thermosensitive compositions comprising a monomer or oligomer having perfluoroalkyl or polysiloxane groups and crosslinkable terminal groups, a thermosensitive initiator, and an infrared absorbing dye or pigment.

Visible or ultraviolet light sensitive materials useful for negative-working wet plates of this invention include, for example, semisolid photosensitive compositions comprising a crosslinkable monomer or oligomer, a visible or ultraviolet light sensitive initiating system (consisting of initiator and optionally coinitiator and/or sensitizer), and optionally a polymer. Such materials are also useful as the radiation-sensitive layer for plates having a top oleophobic layer.

Visible or ultraviolet light sensitive oleophobic materials useful as oleophobic radiation-sensitive layer in waterless plates of this invention include, for example, semisolid photosensitive compositions comprising a monomer or oligomer having perfluoroalkyl or polysiloxane groups and crosslinkable terminal groups, a visible or ultraviolet light sensitive initiating system, and optionally a polymer.

The top oleophobic layer may comprise any oleophobic film-forming material, preferably an oleophobic polymer. Suitable oleophobic polymers include silicone rubbers and perfluorocarbon groups-containing polymers. Silicone rubbers (silicone elastomers or crosslinked polydiorganosiloxanes) are preferred polymers. The oleophobic polymer layer may optionally contain pigments and fillers such as silica, calcium carbonate, and titanium oxide. Adhesion promoters may also be added to the coating to improve silicone layer formation. Various silicone rubber layers are described in, for example, U.S. Pat. Nos. 5,919,600, 6,194,122, 5,379,689, 5,955,238, and 5,353,705, and can be used as the top oleophobic layer of this invention. The silicone rubber layer may be deposited on the radiation-sensitive layer from a solution or dispersion. The silicone may be crosslinked by baking or radiation curing; for radiation curing the radiation should be at a different wavelength from the actinic light for the radiation-sensitive layer so that the radiation curing of the silicone will not cause hardening of the radiation-sensitive layer. Coating methods for applying silicone coatings are known in the art. Examples of suitable coating methods in this invention include roller coating, slit coating, curtain coating, dip coating, and the like. The coating coverage of the silicone layer is preferably from 0.1 to 10 g/m$^2$, and more preferably from 0.5 to about 3.0 g/m$^2$. In developing a plate having a top oleophobic layer, a cleaning procedure such as rubbing with a cloth dampened with isopropanol may be carried out before regular development process (including on-press development).

Suitable polymeric binders for the radiation-sensitive layers of this invention include, for example, polystyrene, acrylic polymers and copolymers (such as polybutylmethacrylate, polyethylmethacrylate, polymethylmethacrylate, polymethylacrylate, butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehye, and butadiene/acrylonitrile copolymer.

Suitable free-radical polymerizable monomers (including oligomers) include, for example, multifunctional acrylate monomers or oligomers (such as acrylate and methacrylate esters of ethylene glycol, trimethylolpropane, pentaerythritol, ethoxylated ethylene glycol and ethoxylated trimethylolpropane, multifunctional urethanated acrylate and methacrylate, and epoxylated acrylate or methacrylate), and oligomeric amine diacrylates.

Suitable free-radical initiators include, for example, the derivatives of acetophenone (such as 2,2-dimethoxy-2-phenylacetophenone, and 2-methyl-1-[4-(methylthio) phenyl]-2-morpholino propan-1-one), onium salts (such as diaryliodonium hexafluoroantimonate, diaryliodonium triflate, triarylsulfonium hexafluorophosphate, triarylsulfonium p-toluenesulfonate, (3-phenylpropan-2-onyl) triaryl phosphonium hexafluoroantimonate, and N-ethoxy(2-methyl)pyridinium hexafluorophosphate), benzophenone, benzil, ketocoumarin (such as 3-benzoyl-7-methoxy coumarin and 7-methoxy coumarin), xanthone, thioxanthone, benzoin or an alkyl-substituted anthraquinone, haloalkyl substituted s-triazine (such as 2,4-bis(trichloromethyl)-6-(p-methoxy-styryl)-s-triazine, 2,4-bis(trichloromethyl)-6-(4-methoxy-naphth-1-yl)-s-triazine and 2,4-bis (trichloromethyl)-6-[(4-ethoxyethylenoxy)-naphth-1-yl]-s-triazine), and titanocene (bis($\eta^9$-2,4-cyclopentadien-1-yl)

bis[2,6-difluoro-3-(1H-pyrrol-1-yl)phenyl) titanium). These initiators can be directly used for certain ultraviolet or visible sensitive plates. A sensitizer, such as a sensitizing dye, may be added to achieve sensitivity of the initiating system in a certain wavelength, especially in the visible region and possibly the infrared region. For thermosensitive plate, an infrared absorbing dye or pigment is added to allow light-to-heat conversion. In addition to absorbing infrared light to generate heat, infrared absorbing dye may also act as a sensitizer that facilitates the thermal decomposition of the initiator through charge transfer.

Various free radical initiators as described above can be used as the thermosensitive free radical initiator of this invention. The initiator must be capable of generating free radical at elevated temperature and/or through charge transfer from a radiation-activated infrared dye. Onium salts and s-triazines are particularly useful thermosensitive free radical initiators. Suitable onium salts include, for example, diazonium salts (such as aryldiazonium hexafluoroantimonate), iodonium salts (such as diaryliodonium hexafluoroantimonate and diaryliodonium triflate), sulfonium salts (such as triarylsulfonium hexafluorophosphate and triarylsulfonium p-toluenesulfonate), phosphonium salts (such as (3-phenylpropan-2-onyl) triaryl phosphonium hexafluoroantimonate), and pyridinium salts (such as N-ethoxy(2-methyl)pyridinium hexafluorophosphate). Examples of suitable onium salts are also described in U.S. Pat. Nos. 5,955,238, 6,037,098, and 5,629,354, and "Handbook of Radical Vinyl Polymerization" edited by Mishra, et al (Marcel Dekker, New York, 1998), Chapter 7, pages 178–179. Iodonium salts and sulfonium salts are preferred onium salts. Examples of suitable s-triazines are 2,4-bis(trichloromethyl)-6-(p-methoxy-styryl)-s-triazine, 2,4-bis(trichloromethyl)-6-(4-methoxy-naphth-1-yl)-s-triazine, and 2,4-bis(trichloromethyl)-6-[(4-ethoxyethylenoxy)-naphth-1-yl]-s-triazine, and are also described in U.S. Pat. Nos. 5,955,238, 6,037,098, 6,010,824, and 5,629,354.

Suitable polyfunctional epoxy monomers include, for example, 3,4-epoxycyclohexylmethyl-3,4-epoxycyclohexane carboxylate, bis-(3,4-epoxycyclohexymethyl) adipate, difunctional bisphenol A/epichlorohydrin epoxy resin and multifunctional epichlorohydrin/tetraphenylol ethane epoxy resin.

Suitable cationic photoinitiators include, for example, triarylsulfonium hexafluoroantimonate, triarylsulfonium hexafluorophosphate, diaryliodonium hexafluoroantimonate, and haloalkyl substituted s-triazine. It is noted that most cationic initiators are also free radical initiators because, in addition to generating Bronsted acid, they also generate free radicals during photo or thermal decomposition.

Infrared absorbing materials useful in the thermosensitive layer of this invention include any infrared light absorbing dye or pigment (also called infrared dyes or pigments) effectively absorbing an infrared radiation having a wavelength of 700 to 1,500 nm. It is preferable that the infrared dye or pigment has an absorption maximum between 750 and 1,200 nm. Various infrared absorbing dyes or pigments are described in U.S. Pat. Nos. 5,858,604, 5,922,502, 6,022,668, 5,705,309, 6,017,677, and 5,677,106, and can be used in the thermosensitive layer of this invention. Examples of useful infrared absorbing dyes include squarylium, croconate, cyanine, polymethine, phthalocyanine, merocyanine, chalcogenopyryloarylidene, oxyindolizine, quinoid, indolizine, pyrylium and metal dithiolene dyes. Examples of useful infrared absorbing pigments include black pigments, metal powder pigments, phthalocyanine pigments, and carbon black. Mixtures of dyes, pigments, or both can also be used. Infrared dye is preferred over infrared pigment. These dyes or pigments can be added in the thermosensitive layer at 0.1 to 30% by weight of the thermosensitive layer, preferably 0.5 to 10%.

For on-press developable plates of this invention, various surfactants may be added into the radiation-sensitive layer to allow or enhance the on-press ink and/or fountain solution developability. Both polymeric and small molecule surfactants can be used. However, it is preferred that the surfactant has low or no volatility so that it will not evaporate from the radiation-sensitive layer of the plate during storage and handling. Nonionic surfactants are preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g radiation-sensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol; ethoxylated or propoxylated acrylate oligomers; and polyethoxylated alkylphenols and polyethoxylated fatty alcohols. The nonanionic surfactant can be added at from 0.2 to 30% by weight of the thermosensitive layer, preferably from 1 to 15%.

In a preferred embodiment as for thermosensitive lithographic printing plates of this invention, the thermosensitive layer comprises at least one polymeric binder (with or without ethylenic functionality), at least one photopolymerizable ethylenically unsaturated monomer (or oligomer) having at least one terminal ethylenic group capable of forming a polymer by free-radical polymerization, at least one free-radical initiator capable of generating free radical at elevated temperature and/or through charge transfer from a radiation-activated infrared dye, and at least one infrared absorbing dye or pigment. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The monomer-to-polymer weight ratio is preferably larger than 1, more preferably larger than 1.5, and most preferably larger than 2.0.

In a second preferred embodiment as for thermosensitive lithographic printing plates of this invention, the thermosensitive layer comprises at least one epoxy or vinyl ether monomer (or oligomer) having at least one epoxy or vinyl ether functional group, at least one Bronsted acid generator capable of generating free acid at elevated temperature or through charge transfer from an radiation-activated infrared dye, and at least one infrared absorbing dye or pigment, optionally with one or more polymeric binders. Other additives such as surfactant, dye or pigment, exposure-indicating dye, and acid quencher (usually an alkaline compound, such as tetrabutylammonium hydroxide or triethylamine) may be added.

In a preferred embodiment as for visible or ultraviolet light sensitive lithographic printing plates of this invention, the radiation-sensitive layer comprises at least one polymeric binder (with or without ethylenic functionality), at least one photopolymerizable ethylenically unsaturated monomer (or oligomer) having at least one terminal ethylenic group capable of forming a polymer by free-radical polymerization, at least one visible or ultraviolet light sensitive free-radical initiator, optionally with addition of a sensitizer and/or coinitiator. Other additives such as surfactant, dye or pigment, exposure-indicating dye, and free-radical stabilizer may be added. The monomer-to-polymer weight ratio is preferably larger than 1, more preferably larger than 1.5, and most preferably larger than 2.0.

When a photoinitiator is used as the free acid or free radical initiator in the thermosensitive layer, the photoinitiator can be sensitive to ultraviolet light (or even visible light), or can be only sensitive to light of shorter wavelength, such as lower than 350 nm. Thermosensitive layer containing ultraviolet light (or visible light) sensitive photoinitiator will also allow actinic exposure with ultraviolet light (or visible light). Thermosensitive layer containing photoinitiator only sensitive to shorter wavelength (such as shorter than 350 nm) will have good white light stability. Each type of initiators has its own advantage, and can be used to design a specific product. In this patent, all types of photoinitiators can be used.

It is noted that, while the cationic or free radical initiator formulated with an infrared dye or pigment thermally decomposes to produce free acid or free radical upon exposure to an infrared radiation, for certain infrared dyes certain charge transfers from the infrared dye to the initiator may also take place to generate free acid or free radical. In this patent, any thermosensitive initiating system comprising an initiator and an infrared absorbing dye or pigment capable of generating free acid or free radical upon exposure to an infrared radiation can be used for the thermosensitive layer of the lithographic plate of this invention, irrespective of the free acid or free radical generating mechanism.

On-press developable thermosensitive lithographic plates are described in U.S. patent application Ser. No. 09/656,052, the entire disclosure of which is hereby incorporated by reference. The negative thermosensitive materials described in U.S. patent application Ser. No. 09/656,052, when formulated as semisolid, can be used for the thermosensitive layer of the current invention.

The radiation-sensitive layer may be conformally coated onto a roughened substrate (for example, with Ra of larger than 0.4 micrometer) at thin coverage (for example, of less than 1.0 g/m$^2$) so that the plate can have microscopic peaks and valleys on the radiation-sensitive layer coated surface and exhibit low tackiness and good block resistance, as described in U.S. patent application Ser. No. 09/605,018, the entire disclosure of which is hereby incorporated by reference.

For plates without a top oleophobic layer, a developer soluble or dispersible protective overcoat may be deposited on top of the radiation-sensitive layer to, for example, protect the radiation-sensitive layer from oxygen inhibition, contamination, and/or physical damage during handling, and/or reduce tackiness and blocking tendency. Such an overcoat is especially useful for plates having a free radical polymerizable radiation-sensitive layer when higher photospeed is required, since the overcoat acts as an oxygen barrier layer to prevent or reduce oxygen inhibition of the free radical polymerization and increase the photospeed. The overcoat preferably comprises a water-soluble polymer, such as polyvinyl alcohol (including various water-soluble derivatives of polyvinyl alcohol). Various additives, such as surfactant, wetting agent, defoamer, leveling agent, and dispersing agent, can be added into the overcoat formulation to facilitate, for example, the coating or development process. Various nonionic surfactants and ionic surfactants can be used. Examples of surfactants useful in the overcoat of this invention include polyethylene glycol, polypropylene glycol, and copolymer of ethylene glycol and propylene glycol, polysiloxane surfactants, perfluorocarbon surfactants, sodium dioctylsulfosuccinate, sodium dodecylbenzenesulfonate, and ammonium laurylsulfate. The surfactant can be added preferably at 0.02 to 40% by weight of the overcoat, more preferably at 0.2 to 15%. For on-press developable plates, the overcoat can be soluble or dispersible in ink and/or fountain solution. The overcoat preferably has a coverage of 0.001 to 6 g/m$^2$, more preferably from 0.005 to 3 g/m$^2$. For plates having a tacky radiation-sensitive layer coated surface, a thicker overcoat (such as 0.5 to 3 g/m$^2$) may be utilized to reduce the tackiness of the plate. For plates to be developed with a conventional liquid developer, a relatively thicker overcoat (such as 0.2 to 3 g/m$^2$) is preferably used. For on-press ink and/or fountain solution developable plates, a relatively thinner overcoat (such as 0.005 to 1 g/m$^2$) is preferably used.

A transparent cover sheet may be laminated onto the surface of the plate (with or without an overcoat or top oleophobic layer) to, for example, protect the radiation-sensitive layer from oxygen inhibition, contamination, and/or physical damage during handling, and/or reduce tackiness and blocking tendency. The cover sheet can be peeled off after exposure. A non-sticky interleaf may be placed between the plates to prevent blocking to each other during storage and handling.

For plates with rough and/or porous surface capable of mechanical interlocking with a coating deposited thereon, a thin releasable interlayer soluble or dispersible in ink (for waterless plate) or ink and/or fountain solution (for wet plate) may be deposited between the substrate and the radiation-sensitive layer. Here the substrate surface is rough and/or porous enough and the interlayer is thin enough to allow bonding between the radiation-sensitive layer and the substrate through mechanical interlocking. Such a plate configuration is described in U.S. Pat. No. 6,014,929, the entire disclosure of which is hereby incorporated by reference.

The visible light lasers useful for the imagewise exposure of the visible light sensitive plates of this invention include, for example, frequency-doubled Nd/YAG laser (about 532 nm), argon ion laser (about 488 nm), and violet diode laser (about 410 nm). As for infrared laser diode, violet laser diode is especially useful for on-press imaging (as well as off-press imaging) because of its small size and relatively lower cost. The exposure dosage is preferably about 0.0001 to about 500 mJ/cm$^2$, and more preferably about 0.001 to about 50 mJ/cm$^2$, depending on the sensitivity of the radiation-sensitive layer.

Infrared lasers useful for the imagewise exposure of the thermosensitive plates of this invention include laser sources emitting in the near infrared region, i.e. emitting in the wavelength range of from 700 to 1500 nm, and preferably from 750 to 1200 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably about 1 to about 2000 mJ/cm$^2$, and more preferably about 5 to about 1000 mJ/cm$^2$, depending on the sensitivity of the thermosensitive layer.

Laser imaging devices are currently widely available commercially. Any device can be used which provides imagewise laser exposure according to digital imaging information. Commonly used imaging devices include flatbed imager, internal drum imager, and external drum imager. Internal drum imager and external drum imager are preferred imaging devices.

For on-press developable plates of this invention, the plate can be imaged off press or on press. For off-press imaging, the plate is imagewise exposed with a laser in a plate imaging device, and the exposed plate is then mounted on the plate cylinder of a lithographic press to be developed with ink (for waterless plate) or with ink and/or fountain solution (for wet plate) by rotating the press cylinders and contacting the plate with ink and/or fountain solution and to lithographically print images from said plate to the receiving media (such as papers). For on-press imaging, the plate is exposed while mounted on a lithographic printing press cylinder, and the exposed plate is directly developed on press with ink and/or fountain solution during initial press operation and then prints out regular printed sheets. This is especially suitable for computer-to-press application in which the plate (or plates, for multiple color press) is directly exposed on the plate cylinder of a press according to computer generated digital imaging information and, with minimum or no treatment, directly prints out regular printed sheets. For on-press development, good quality prints should be obtained preferably under 20 initial impressions, and more preferably under 5 impressions.

For conventional wet press, usually fountain solution is applied (to contact the plate) first, followed by contacting with ink roller. For press with integrated inking system, the ink and fountain solution are emulsified by the various press rollers before being transferred to the plate as emulsion of ink and fountain solution. However, in this invention, the ink and fountain solution may be applied at any combination or sequence, as needed for the plate. There is no particular limitation. The recently introduced single fluid ink by Flink Ink Company, which can be used for printing wet lithographic plate without the use of fountain solution, can also be used for the on-press development and printing of the plate of this invention.

An on-press developable lithographic plate may be rinsed or applied with an aqueous solution, including water and fountain solution, to remove the water-soluble or dispersible overcoat (for plate with an overcoat) and/or to dampen without developing the plate, after imagewise exposure and before on-press development with ink and/or fountain solution.

For on-press developable lithographic plates having a free radical crosslinkable radiation-sensitive layer, a liquid layer may be applied onto the surface of the plate (with or without an overcoat) before and/or during imaging process to provide an in situ oxygen barrier layer during the imaging process to allow faster photospeed and better curing. The liquid layer can be any liquid material that is compatible with the plate. Water, fountain solution, and other aqueous solutions are preferred materials for forming the liquid layer. The liquid layer may be applied from a dampening roller of a lithographic press with the plate being mounted on the plate cylinder during on-press imaging process. The dampening roller can be a regular dampening roller which supplies fountain solution during printing or can be a different roller.

For plates having a free radical crosslinkable radiation-sensitive layer, an inert gas (such as nitrogen) may be introduced within the device or near the exposure areas during a laser imaging process to reduce inhibition of free radical polymerization of the radiation-sensitive layer by oxygen. The inert gas may be flushed from a nozzle mounted next to the laser head onto the areas being imaged during the laser imaging process; this is especially useful for external drum imaging devices, including off-press laser imaging devices having an external drum and on-press laser imaging devices utilizing plate cylinder as the imaging drum.

This invention is further illustrated by the following examples of its practice. Unless specified, all the values are by weight.

EXAMPLE 1

An electrochemically grained, anodized, and silicate treated aluminum substrate (with a Ra of about 0.5 microns) was coated using a #6 Meyer rod with a thermosensitive layer formulation RS-1, followed by drying in an oven at 80° C. for 5 min.

| RS-1 | |
|---|---|
| Component | Weight ratios |
| Neocryl B-728 (Polymer from Zeneca) | 2.73 |
| Sartomer SR-399 (Acrylic monomer from Sartomer) | 6.52 |
| Pluronic L43 (Nonionic surfactant from BASF) | 0.56 |
| 4-((2-Hydroxytetradecyl)-oxy-phenyl) phenyl iodonium antimonate | 0.50 |
| PINA FK-1026 (Polymethine infrared absorbing dye from Allied Signal) | 0.20 |
| Acetone | 90.2 |

The above plate was exposed with an infrared laser plate imager equipped with laser diodes emitting at about 830 nm (Pearlsetter™, from Presstek). The plate was mounted on the imaging drum (external drum) and exposed at a laser dosage of about 600 mJ/cm$^2$. The exposed areas were bleached from the original slightly green color of the plate. The plate was cut into two sheets for further tests.

The first sheet was developed with a Viking brand negative plate developer. The plate was wiped with a cloth soaked with the developer. The radiation-sensitive layer in the exposed areas stayed and the radiation-sensitive layer in the non-exposed areas cleaned off. The developed plate was further wiped with a cloth soaked with ink and fountain solution. The exposed areas received ink and the non-exposed areas repelled ink.

The second sheet was tested on a wet lithographic press (AB Dick 360) equipped with integrated inking/dampening system. The exposed plate was directly mounted on the plate cylinder of the press. The press was started for 10 rotations, and the ink roller (carrying emulsion of ink and fountain solution) was then applied to the plate cylinder to rotate until the plate showed clean background. The plate cylinder was then engaged with the blanket cylinder and printed with papers. The printed sheets showed clean background and good inking under 10 impressions. The press continued to run for a total of 100 impressions without showing any wearing (The press stopped at 100 impressions.).

The unexposed plate coated above on an electrochemically roughened, anodized, and silicate treated aluminum substrate was checked for tackiness by pressing with fingers and was found to be non-tacky. It is noted that the non-tackiness of the plate was achieved by conformally coating the thermosensitive layer at thin enough thickness on the roughened aluminum substrate; such a coating configuration is described in U.S. patent application Ser. No. 05/609,018, and is utilized in this invention to prepare non-tacky plates from semisolid radiation-sensitive layers.

To examine the physical form of the thermosensitive layer, RS-1 was coated on an ungrained, smooth aluminum sheet with a #6 Meyer rod, followed by drying in an oven at 80° C. for 5 min. The coating surface was checked by gentle pressing with fingers. The coating formed fingerprints and was tacky to touch, indicating that the thermosensitive layer is a semisolid material.

EXAMPLE 2 (COMPARATIVE EXAMPLE FOR EXAMPLE 1)

This example demonstrates that a plate having a solid radiation-sensitive layer has much slower photospeed or much less sufficient hardening than a plate having a semisolid radiation-sensitive layer, and is incapable of hardening in certain exposure condition suitable for hardening a similar plate having a semisolid radiation-sensitive layer.

An electrochemically roughened, anodized, and silicate treated aluminum substrate (with a Ra of about 0.5 microns) was coated using a #6 Meyer rod with a thermosensitive layer formulation RS-2, followed by drying in an oven at 80° C. for 5 min.

| RS-2 | |
| --- | --- |
| Component | Weight ratios |
| Neocryl B-728 (Polymer from Zeneca) | 6.6 |
| Sartomer SR-399 (Acrylic monomer from Sartomer Company) | 6.5 |
| Pluronic L43 (Nonionic surfactant from BASF) | 0.55 |
| 4-((2-hydroxytetradecyl)-oxy-phenyl) phenyl iodonium antimonate | 0.50 |
| PINA FK-1026 (Polymethine infrared absorbing dye from Allied Signal) | 0.20 |
| Acetone | 129 |

The plate was exposed and developed with a Viking negative plate developer using the same procedures as in EXAMPLE 1. The infrared laser exposure dosage was about 600 mJ/cm$^2$. No imaged pattern was observed in the exposed areas. The plate was wiped with a cloth soaked with a Viking brand negative plate developer. The radiation-sensitive layer was completely cleaned off and no imaging pattern was seen. The developed plate was further wiped with a cloth soaked with ink and fountain solution, and no inked imaging pattern was observed.

To examine the physical form of the thermosensitive layer, RS-2 was coated on an ungrained, smooth aluminum sheet with a #6 Meyer rod, followed by drying in an oven at 80° C. for 5 min. The coating surface was checked by gentle pressing with fingers. The coating did not form fingerprints and was non-tacky to touch, indicating that the thermosensitive layer is a solid material.

EXAMPLE 3

The plate prepared in EXAMPLE 1 was further coated with a water-soluble overcoat OC-1 using a #6 Meyer rod, followed by drying in an oven at 80° C. for 5 min.

| OC-1 | |
| --- | --- |
| Component | Weight ratios |
| Airvol 205 (Polyvinyl alcohol from Air Products and Chemicals Company) | 2.00 |
| Zonyl FSO (Perfluorinated surfactant from DuPont) | 0.02 |
| Water | 98.00 |

The overcoated plate was exposed and on-press developed as in EXAMPLE 1. The printed sheets showed clean background and good inking under 5 impressions. The plate continued to run for a total of 100 impressions without showing any wearing (The press stopped at 100 sheets.).

EXAMPLE 4

The plate prepared in EXAMPLE 1 was further coated with a water-soluble overcoat OC-2 using a #6 Meyer rod, followed by drying in an oven at 80° C. for 5 min.

| OC-2 | |
| --- | --- |
| Component | Weight ratios |
| Airvol 205 (Polyvinyl alcohol from Air Products and Chemicals Company) | 10 |
| Zonyl FSO (Perfluorinated surfactant from DuPont) | 0.05 |
| Water | 90 |

The overcoated plate was exposed as in EXAMPLE 1. The exposed plate was developed with a Viking brand negative plate developer (from 3M). The plate was wiped with a cloth soaked with the developer. The radiation-sensitive layer in the exposed areas stayed and the radiation-sensitive layer in the non-exposed areas cleaned off. The developed plate was further wiped with a cloth soaked with ink and fountain solution. The exposed areas received ink and the non-exposed areas repelled ink. The plate was further rubbed with a cloth soaked with acetone for 200 times and no wearing of the radiation-sensitive layer in the exposed areas was observed, indicating excellent durability.

EXAMPLE 5

In this example, the plate is the same as in EXAMPLE 1 except that a thin releasable interlayer (a water-soluble polymer) is interposed between the substrate and the thermal sensitive layer.

An electrochemically roughened, anodized, and silicate treated aluminum sheet was first coated with a 0.2% aqueous solution of polyvinyl alcohol (Airvol 540, from Air Products and Chemicals) with a #6 Meyer rod, followed by drying in an oven at 80° C. for 5 min. The polyvinyl alcohol coated substrate was further coated with the thermosensitive layer formulation RS-1 with a #6 Meyer rod, followed by drying in an oven at 80° C. for 5 min.

The plate was exposed and on-press developed as in EXAMPLE 1. The printed sheets showed clean background and good inking under 5 impressions. The plate continued to run for a total of 100 impressions without showing any wearing (The press stopped at 100 sheets.).

EXAMPLE 6

An electrochemically roughened, anodized, and silicate treated aluminum sheet was coated using a #6 Meyer rod with a thermosensitive layer formulation RS-3, followed by drying in an oven at 80° C. for 5 min.

RS-3

| Component | Weight ratios |
| --- | --- |
| Neocryl B-728 (Polymer from Zeneca) | 2.776 |
| Sartomer SR-399 (Acrylic monomer from Sartomer) | 6.635 |
| Pluronic L43 (Nonionic surfactant from BASF) | 0.565 |
| Irganox 1035 (Antioxidant from Ciba-Geigy) | 0.012 |
| 2,6-Di-tert-butyl-4-methylphenol | 0.012 |
| Irgacure 369 (Initiator from Ciba-Geigy) | 0.50 |
| 4-((2-hydroxytetradecyl)-oxy-phenyl) phenyl iodonium antimonate | 0.70 |
| PINA FK-1026 (Polymethine infrared absorbing dye from Allied Signal) | 0.50 |
| Acetone | 90.000 |

The plate was exposed with an infrared laser plate imager equipped with laser diodes emitting at about 830 nm (Trendsetter™, from CreoScitex). The plate was mounted on the imaging drum (external drum) and exposed at a laser dosage of about 400 mJ/cm$^2$.

The plate was on-press developed as in EXAMPLE 1. The printed sheets showed clean background and good inking under 5 impressions. The plate continued to run for a total of 100 impressions without showing any wearing (The press stopped at 100 sheets.).

To examine the physical form of the thermosensitive layer, RS-3 was coated on an ungrained, smooth aluminum sheet with a #6 Meyer rod, followed by drying in an oven at 80° C. for 5 min. The coating surface was checked by gentle pressing with fingers. The coating formed fingerprints and was tacky to touch, indicating semisolid state.

EXAMPLE 7

An electrochemically roughened, anodized, and silicate treated aluminum sheet was coated using a #6 Meyer rod with a thermosensitive layer formulation RS-4, followed by drying in an oven at 80° C. for 5 min.

RS-4

| Component | Weight ratios |
| --- | --- |
| Neocryl B-728 (Polymer from Zeneca) | 2.634 |
| Sartomer SR-399 (Acrylic monomer from Sartomer) | 6.296 |
| Pluronic L43 (Nonionic surfactant from BASF) | 0.536 |
| Leucomalachite Green | 0.512 |
| Irganox 1035 (Antioxidant from Ciba-Geigy) | 0.011 |
| 2,6-Di-tert-butyl-4-methylphenol | 0.011 |
| 2,4-bis(trichloromethyl)-6-piperonyl-s-triazine | 0.50 |
| PINA FK-1026 (Polymethine infrared absorbing dye from Allied Signal) | 0.20 |
| Acetone | 90.0 |

The thermosensitive layer coated substrate was further coated with the water-soluble overcoat OC-2 using a #6 Meyer rod, followed by drying in an oven at 80° C. for 5 min.

The exposed plate was developed with a Viking brand negative plate developer (from 3M) by wiping with a cloth soaked with the plate developer. The radiation-sensitive layer in the exposed areas stayed and the radiation-sensitive layer in the non-exposed areas cleaned off. The developed plate was further wiped with a cloth soaked with ink and fountain solution. Good inked image pattern in the exposed areas and clean background in the non-exposed areas was observed.

To examine the physical form of the thermosensitive layer, RS-4 was coated on an ungrained, smooth aluminum sheet with a #6 Meyer rod, followed by drying in an oven at 80° C. for 5 min. The coating surface was checked by gentle pressing with fingers. The coating formed fingerprints and was tacky to touch, indicating semisolid state.

EXAMPLE 8

An electrochemically roughened, anodized, and polyvinyl phosphonic acid treated aluminum sheet was coated using a #6 Meyer rod with a thermosensitive layer formulation RS-5, followed by drying in an oven at 70° C. for 5 min.

RS-5

| Component | Weight ratios |
| --- | --- |
| Epon 1031 (Epoxy resin from Shell Chemical Company) | 2.33 |
| Cyracure UVR-6110 (Epoxy resin from Union Carbide) | 3.79 |
| Cyracure UVI-6974 (Cationic initiator from Union Carbide) | 0.85 |
| 4-((2-hydroxytetradecyl)-oxy-phenyl) phenyl iodonium antimonate | 0.25 |
| Neocryl B-728 (Polymer from Zeneca) | 2.52 |
| IR-140 (Infrared dye from Eastman Kodak) | 0.65 |
| FC120 (Surfactant from 3M) | 0.036 |
| Ethyl acetate | 78.8 |
| Acetone | 10.7 |

The above plate was exposed with an infrared laser plate imager equipped with laser diodes (8-channels, about 500 mW each) emitting at about 830 nm (ThermalSetter™, from Optronics International). The plate was placed on the imaging drum and secured with vacuum and masking tapes. The exposure dosage was controlled by the drum speed. The plate was exposed at a laser dosage of about 300 mJ/cm$^2$. The exposed plate showed dark-blue color in the image areas.

The exposed plate was subjected to hand test for on-press developability. The plate was rubbed back and forth for 10 times with a cloth soaked with both fountain solution and ink to check on-press developability and inking. The plate developed completely under 8 double rubs, with the exposed areas remaining and the non-exposed areas being completely removed. The developed plate showed well-inked imaging pattern and clean background.

EXAMPLE 9

This example illustrates a plate having a semisolid ultraviolet light sensitive radiation-sensitive-layer. An electrochemically roughened, anodized, and polyvinyl phosphonic acid treated aluminum sheet was coated using a #6 Meyerrod with a radiation-sensitive layer formulation RS-6, followed by drying in an oven at 80° C. for 5 min.

| RS-6 | |
|---|---|
| Component | Weight ratios |
| Neocryl B-728 (Polymer from Zeneca) | 2.75 |
| Sartomer SR-399 (Acrylic monomer from Sartomer) | 5.55 |
| Pluronic L43 (Nonionic surfactant from BASF) | 0.409 |
| Microlith Green G-K (Pigment dispersion from Ciba-Geigy, with 45% green pigment and 50% polymer) | 0.415 |
| Leuco crystal violet | 0.125 |
| Irganox 1035 (Antioxidant from Ciba-Geigy) | 0.011 |
| 2,6-Di-tert-butyl-4-methylphenol | 0.011 |
| Irgacure 907 (Initiator from Ciba-Geigy) | 0.415 |
| Isopropyl thioxanthone (Sensitizer) | 0.208 |
| 2,4-bis(trichloromethyl)-6-(4-methoxy-naphth-1-yl)-s-triazine | 0.104 |
| 2-Butanone | 90.0 |

The plate was placed under a negative photomask and exposed to an UV light with an emission peak of about 364 nm for 2 min. using an INSTANT 2 VACUUM PRINTER 24×28 exposure device (manufactured by Berkey Technical Co., New York). The exposed plate was developed by wiping with a cloth soaked with acetone. The green radiation-sensitive layer in the exposed areas stayed and the radiation-sensitive layer in the non-exposed areas cleaned off. The developed plate was further rubbed with the cloth soaked with acetone for 200 rubs, and showed no wearing of the radiation-sensitive layer, indicating sufficient hardening and excellent durability.

To examine the physical form of the radiation-sensitive layer, RS-6 was coated on an ungrained, smooth aluminum sheet with a #6 Meyer rod, followed by drying in an oven at 80° C. for 5 min. The coating surface was checked by gentle pressing with fingers. The coating formed fingerprints and was tacky to touch, indicating that the radiation-sensitive layer is a semisolid material.

EXAMPLE 10 (COMPARATINE EXAMPLE FOR EXAMPLE 9)

This example demonstrates that a plate having a solid radiation-sensitive layer has much slower photospeed or much less sufficient hardening than a plate having a semisolid radiation-sensitive layer.

An electrochemically roughened, anodized, and polyvinyl phosphonic acid treated aluminum sheet was coated using a #6 Meyer rod with a radiation-sensitive layer formulation RS-7, followed by drying in an oven at 80° C. for 5 min.

| RS-7 | |
|---|---|
| Component | Weight ratios |
| Neocryl B-728 (Polymer from Zeneca) | 6.55 |
| Sartomer SR-399 (Acrylic monomer from Sartomer) | 5.55 |
| Pluronic L43 (Nonionic surfactant from BASF) | 0.409 |
| Microlith Green G-K (Pigment dispersion from Ciba-Geigy, with 45% green pigment and 50% polymer) | 0.415 |
| Leuco crystal violet | 0.125 |
| Irganox 1035 (Antioxidant from Ciba-Geigy) | 0.011 |
| 2,6-Di-tert-butyl-4-methylphenol | 0.011 |
| Irgacure 907 (Initiator from Ciba-Geigy) | 0.415 |
| Isopropyl thioxanthone (Sensitizer) | 0.208 |
| 2,4-bis(trichloromethyl)-6-(4-methoxy-naphth-1-yl)-s-triazine | 0.104 |
| 2-Butanone | 90.0 |

The plate was exposed with ultraviolet light and developed with acetone using the same procedures as in EXAMPLE 9. The green radiation-sensitive layer on the exposed plate was completely removed when wiping with a cloth soaked with acetone, indicating insufficient hardening and poor durability.

To examine the physical form of the thermosensitive layer, RS-7 was coated on an ungrained, smooth aluminum sheet with a #6 Meyer rod, followed by drying in an oven at 80° C. for 5 min. The coating surface was checked by gentle pressing with fingers. The coating did not form fingerprints and was non-tacky to touch, indicating that the radiation-sensitive layer is a solid material.

EXAMPLE 11

This example illustrates a plate having a semisolid visible light sensitive radiation-sensitive layer. An electrochemically roughened, anodized, and polyvinyl phosphonic acid treated aluminum sheet was coated using a #6 Meyer rod with a radiation-sensitive layer formulation RS-8, followed by drying in an oven at 80° C. for 5 min.

| RS-8 | |
|---|---|
| Component | Weight ratios |
| Neocryl B-728 (Polymer from Zeneca) | 2.85 |
| Sartomer SR-399 (Acrylic monomer from Sartomer) | 5.75 |
| Pluronic L43 (Nonionic surfactant from BASF) | 0.39 |
| Microlith Green G-K (Pigment dispersion from Ciba-Geigy, with 45% green pigment and 50% polymer) | 0.43 |
| Leuco crystal violet | 0.13 |
| Irganox 1035 (Antioxidant from Ciba-Geigy) | 0.010 |
| 2,6-Di-tert-butyl-4-methylphenol | 0.010 |
| Irgacure 784 (Visible light sensitive photoinitiator from Ciba-Geigy) | 0.43 |
| 2-Butanone | 90.0 |

The radiation-sensitive layer coated plate was further coated with a water-soluble overcoat OC-1 using a #6 Meyer rod, followed by drying in an oven at 80° C. for 5 min.

The plate was exposed under a negative mask in a vacuum frame with an office-type fluorescence light source (total of 120 watts) for 8 min. The exposed plate was developed by wiping with a cloth soaked with acetone. The green radiation-sensitive layer in the exposed areas stayed and the radiation-sensitive layer in the non-exposed areas cleaned off. The developed plate was further rubbed with the cloth soaked with acetone for 200 rubs, and showed no wearing of the radiation-sensitive layer, indicating sufficient hardening and excellent durability.

To examine the physical form of the radiation-sensitive layer, RS-8 was coated on an ungrained, smooth aluminum sheet with a #6 Meyer rod, followed by drying in an oven at 80° C. for 5 min. The coating surface was checked by gentle pressing with fingers. The coating formed fingerprints and was tacky to touch, indicating that the radiation-sensitive layer is a semisolid material.

EXAMPLE 12 (COMPARATIVE EXAMPLE FOR EXAMPLE 11)

This example demonstrates that a plate having a solid radiation-sensitive layer has much slower photospeed or much less sufficient hardening than a plate having a semisolid radiation-sensitive layer.

An electrochemically roughened, anodized, and polyvinyl phosphonic acid treated aluminum sheet was coated using a

6 Meyer rod with a radiation-sensitive layer formulation RS-9, followed by drying in an oven at 80° C. for 5 min.

RS-9

| Component | Weight ratios |
|---|---|
| Neocryl B-728 (Polymer from Zeneca) | 6.65 |
| Sartomer SR-399 (Acrylic monomer from Sartomer) | 5.75 |
| Pluronic L43 (Nonionic surfactant from BASF) | 0.39 |
| Microlith Green G-K (Pigment dispersion from Ciba-Geigy, with 45% green pigment and 50% polymer) | 0.43 |
| Leuco crystal violet | 0.13 |
| Irganox 1035 (Antioxidant from Ciba-Geigy) | 0.010 |
| 2,6-Di-tert-butyl-4-methylphenol | 0.010 |
| Irgacure 784 (Visible light sensitive photoinitiator from Ciba-Geigy) | 0.43 |
| 2-Butanone | 124.0 |

The radiation-sensitive layer coated plate was further coated with a water-soluble overcoat OC-1 using a #6 Meyer rod, followed by drying in an oven at 80° C. for 5 min.

The plate was exposed with visible light and developed with acetone using the same procedures as in EXAMPLE 11. The green radiation-sensitive layer on the exposed plate was completely cleaned off when wiping with a cloth soaked with acetone, indicating insufficient hardening and poor durability.

To examine the physical form of the radiation-sensitive layer, RS-9 was coated on an ungrained, smooth aluminum sheet with a #6 Meyer rod, followed by drying in an oven at 80° C. for 5 min. The coating surface was checked by gentle pressing with fingers. The coating did not form fingerprints and was non-tacky to touch, indicating that the radiation-sensitive layer is a solid material.

I claim:

1. A method of imaging a lithographic plate, comprising in order:
    (a) providing a lithographic plate comprising on a substrate a semisolid radiation-sensitive layer capable of hardening upon exposure to a laser selected from the group consisting of infrared laser, visible laser, and ultraviolet laser; said radiation-sensitive layer exhibiting an affinity or aversion substantially opposite to the affinity or aversion of said substrate to at least one printing liquid selected from the group consisting of ink and an adhesive fluid for ink; wherein said substrate has a roughened surface comprising, at least, peaks and valleys, and said radiation-sensitive layer is substantially conformally coated on the roughened substrate surface so that the surface of said radiation-sensitive layer has peaks and valleys substantially corresponding to the major peaks and valleys of the substrate microscopic surface; and said substrate has an average surface roughness Ra of 0.2 to 2.0 microns, said radiation-sensitive layer has an average coverage of 0.1 to 2.0 $g/m^2$, and the average height of the valleys on the radiation-sensitive layer surface is at least 0.1 microns below the average height of the peaks on the radiation-sensitive layer surface; and
    (b) imagewise exposing the plate with said laser according to digital imaging information to cause hardening of the radiation-sensitive layer in the exposed areas.

2. The method of claim 1 wherein said radiation-sensitive layer is capable of hardening upon exposure to an infrared laser and comprises an acrylate or mathacrylate monomer or oligomer, a thermosensitive free-radical initiator, and an infrared absorbing dye; and said plate is exposed with the infrared laser.

3. The method of claim 1 wherein said radiation-sensitive layer is capable of hardening upon exposure to an infrared laser and comprises an epoxy or vinyl ether monomer or oligomer having at least one epoxy or vinyl ether group, a Bronsted acid generator, and an infrared absorbing dye or pigment; and said plate is exposed with the infrared laser.

4. The method of claim 1 wherein said radiation-sensitive layer is capable of hardening upon exposure to a visible or ultraviolet laser, and comprises an acrylate or mathacrylate monomer or oligomer and a visible or ultraviolet laser-sensitive free-radical initiator or initiating system; and said plate is exposed with the visible or ultraviolet laser.

5. The method of claim 1 wherein said radiation-sensitive layer comprises at least one monomer and/or oligomer, and at least one polymer, the weight ratio of the monomers and oligomers to the polymers being larger than 1.5.

6. The method of claim 1 wherein said radiation-sensitive layer comprises at least one monomer and/or oligomer, and at least one polymer, the weight ratio of the monomers and oligomers to the polymers being larger than 2.0.

7. The method of claim 1 wherein said substrate is hydrophilic and said radiation-sensitive layer is oleophilic, and said plate is a wet plate.

8. The method of claim 1 wherein said plate further includes a top water soluble or dispersible polymer layer on the radiation-sensitive layer.

9. A method of lithographically printing images on a receiving medium, comprising in order:
    (a) providing a lithographic plate comprising on a substrate a semisolid radiation-sensitive layer capable of hardening upon exposure to a laser selected from the group consisting of infrared laser, visible laser, and ultraviolet laser; said radiation-sensitive layer being soluble or dispersible in ink (for waterless plate) or in ink and/or fountain solution (for wet plate) and exhibiting an affinity or aversion substantially opposite to the affinity or aversion of said substrate to at least one printing liquid selected from the group consisting of ink and an adhesive fluid for ink; wherein said substrate has a roughened surface comprising, at least, peaks and valleys, and said radiation-sensitive layer is substantially conformally coated on the roughened substrate surface so that the surface of said radiation-sensitive layer has peaks and valleys substantially corresponding to the major peaks and valleys of the substrate microscopic surface; and said substrate has an average surface roughness Ra of 0.2 to 2.0 microns, said radiation-sensitive layer has an average coverage of 0.1 to 2.0 $g/m^2$, and the average height of the valleys on the radiation-sensitive layer surface is at least 0.1 microns below the average height of the peaks on the radiation-sensitive layer surface;
    (b) imagewise exposing the plate with said laser according to digital imaging information to cause hardening of the radiation-sensitive layer in the exposed areas; and
    (c) contacting said exposed plate with ink and/or fountain solution on a lithographic printing press to remove the radiation-sensitive layer in the nonexposed areas, and to lithographically print image from said plate to the receiving medium.

10. The method of claim 9 wherein said radiation-sensitive layer is capable of hardening upon exposure to an infrared laser and comprises an acrylate or mathacrylate monomer or oligomer, a thermosensitive free-radical initiator, and an infrared absorbing dye; and said plate is exposed with an infrared laser.

11. The method of claim 9 wherein said radiation-sensitive layer is capable of hardening upon exposure to a violet laser and comprises an acrylate or mathacrylate monomer or oligomer, and a violet laser-sensitive free-radical initiator or initiating system; and said plate is exposed with a violet laser.

12. The method of claim 9 wherein said plate further includes a releasable interlayer interposed between the substrate and the radiation-sensitive layer, said releasable interlayer being soluble or dispersible in ink (for waterless plate) or in ink and/or fountain solution (for wet plate); wherein the substrate comprises rough and/or porous surface capable of mechanical interlocking with a coating deposited thereon, and the interlayer is substantially conformally coated on the microscopic surfaces of the substrate and is thin enough in thickness, to allow bonding between the radiation-sensitive layer and the substrate through mechanical interlocking.

13. The method of claim 9 wherein said plate further includes an ink and/or fountain solution soluble or dispersible top layer on the radiation-sensitive layer.

14. The method of claim 9 wherein said plate is rinsed or applied with water or an aqueous solution (including fountain solution) to remove the overcoat (for plate with a water soluble or dispersible overcoat) and/or to dampen without developing the radiation-sensitive layer of the plate, after imagewise laser exposure and before on-press development with ink and/or fountain solution.

15. The method of claim 9 wherein said plate is exposed on an imaging device off the press and then mounted onto a plate cylinder of a lithographic press for on-press development with ink and/or fountain solution, and lithographic printing.

16. The method of claim 9 wherein said plate is mounted on a plate cylinder of a lithographic press for the imagewise laser exposure, on-press development with ink and/or fountain solution, and lithographic printing.

17. The method of claim 9 wherein said radiation-sensitive layer is hardened through free radical polymerization upon laser exposure; and an inert gas is supplied to the imaging chamber or at least around the plate surface areas that is being exposed with a laser.

18. The method of claim 9 wherein said radiation-sensitive layer is hardened through free radical polymerization upon laser exposure; and the surface of said plate further includes a liquid, oxygen barrier layer that is coated before or during laser exposure.

19. The method of claim 18 wherein said plate is mounted on a plate cylinder of a lithographic press for the imagewise laser exposure, on-press development with ink and/or fountain solution and lithographic printing; and said liquid oxygen barrier layer is a fountain solution and is applied from a fountain solution roller.

20. A method of imaging a lithographic plate, comprising in order:
(a) providing a lithographic plate comprising on a hydrophilic substrate an oleophilic semisolid radiation-sensitive layer capable of hardening upon exposure to a laser selected from the group consisting of infrared laser, visible laser, and ultraviolet laser, said radiation-sensitive layer composing at least one polymer, at least one free radical polymerizable ethylenically unsaturated monomer and/or oligomer, and at least one free-radical initiator; wherein said substrate has a roughened surface comprising, at least, peaks and valleys, and said radiation-sensitive layer is substantially conformally coated on the roughened substrate surface so that the surface of said radiation-sensitive layer has peaks and valleys substantially corresponding to the major peaks and valleys of the substrate microscopic surface; and said substrate has an average surface roughness Ra of 0.2 to 2.0 microns, said radiation-sensitive layer has an average coverage of 0.1 to 2.0 $g/m^2$, and the average height of the valleys on the radiation-sensitive layer surface is at least 0.1 microns below the average height of the peaks on the radiation-sensitive layer surface; and
(b) imagewise exposing the plate with said laser according to digital imaging information to cause hardening of the radiation-sensitive layer in the exposed areas.

21. The method of claim 20 wherein said plate is exposed with an ultraviolet laser.

22. The method of claim 20 wherein said plate is exposed with a visible laser.

23. The method of claim 22 wherein said visible laser is a violet laser.

24. The method of claim 20 wherein said radiation-sensitive layer further includes an infrared absorbing dye, and said plate is exposed with an infrared laser.

25. The method of claim 20 wherein the weight ratio of the monomers and oligomers to the polymers is larger than 1.0.

26. The method of claim 20 wherein the weight ratio of the monomers and oligomers to the polymers is larger than 1.5.

27. The method of claim 20 wherein the weight ratio of the monomers and oligomers to the polymers is larger than 2.0.

28. The method of claim 20 wherein said plate further includes a water-soluble polymer interlayer interposed between the substrate and the radiation-sensitive layer; wherein the substrate comprises rough and/or porous surface capable of mechanical interlocking with a coating deposited thereon, and the interlayer is substantially conformally coated on the microscopic surfaces of the substrate and is thin enough in thickness, to allow bonding between the radiation-sensitive layer and the substrate through mechanical interlocking.

29. The method of claim 20 wherein said plate further includes a top water soluble or dispersible polymer layer on the radiation-sensitive layer.

30. A method of lithographically printing images on a receiving medium, comprising in order:
(a) providing a lithographic plate comprising on a hydrophilic substrate an oleophilic semisolid radiation-sensitive layer, said radiation-sensitive layer comprising at least one polymer, at least one free radical polymerizable ethylenically unsaturated monomer and/or oligomer, and at least one free-radical initiator, being soluble or dispersible in ink and/or fountain solution, and being capable of hardening upon exposure to a laser selected from the group consisting of infrared laser, visible laser, and ultraviolet laser; wherein the weight ratio of the monomers and oligomers to the polymers is larger than 2.0;
(b) imagewise exposing the plate with said laser according to digital imaging information to cause hardening of the radiation-sensitive layer in the exposed areas; and
(c) contacting said exposed plate with ink and/or fountain solution on a lithographic printing press to remove the radiation-sensitive layer in the non-exposed areas, and to lithographically print images from said plate to the receiving medium.

31. The method of claim 30 wherein said plate is exposed with an ultraviolet laser.

32. The method of claim 30 wherein said plate is exposed with a visible laser.

33. The method of claim 30 wherein said visible laser is a violet laser.

34. The method of claim 32 wherein said radiation-sensitive layer further includes an infrared absorbing dye, and said plate is exposed with an infrared laser.

35. The method of claim 30 wherein said plate further includes a fountain solution soluble or dispersible interlayer interposed between the substrate and the radiation-sensitive layer; wherein the substrate comprises rough and/or porous surface capable of mechanical interlocking with a coating deposited thereon, and the interlayer is substantially conformally coated on the microscopic surfaces of the substrate and is thin enough in thickness, to allow bonding between the radiation-sensitive layer and the substrate through mechanical interlocking.

36. The method of claim 30 wherein said plate further includes an ink and/or fountain solution soluble or dispersible top layer on the radiation-sensitive layer.

37. The method of claim 30 wherein said plate is mounted on a plate cylinder of a lithographic press for the imagewise laser exposure, on-press development with ink and/or fountain solution, and lithographic printing.

38. A method of lithographically printing images on a receiving medium, comprising in order:

(a) mounting onto the plate cylinder of a lithographic press a lithographic plate comprising on a hydrophilic substrate an oleophilic semisolid radiation-sensitive layer capable of hardening through free radical polymerization upon exposure to a laser selected from the group consisting of infrared laser, visible laser, and ultraviolet laser; said radiation-sensitive layer being soluble or dispersible in ink or both ink and fountain solution;

(b) applying an aqueous solution to the surface of the lithographic plate to form an oxygen barrier layer and exposing the plate with said laser according to digital imaging information to cause hardening of the radiation-sensitive layer in the exposed areas, said aqueous solution being applied before and/or during the laser exposure; and (c) contacting said exposed plate with ink and fountain solution on the lithographic printing press to remove the radiation-sensitive layer in the non-exposed areas, and to lithographically print images from said plate to the receiving medium.

39. The method of claim 38 wherein said aqueous solution is a fountain solution and is applied from a fountain solution roller during the laser exposure or before and during the laser exposure.

40. The method of claim 38 wherein said aqueous solution is water and is applied during the laser exposure or before and during the laser exposure.

* * * * *

UNITED STATES PATENT AND TRADEMARK OFFICE
CERTIFICATE OF CORRECTION

PATENT NO. : 6,541,183 B2  Page 1 of 1
DATED : April 1, 2003
INVENTOR(S) : Gary Ganghui Teng It is certified that error appears in the above-identified patent and that said Letters Patent is hereby corrected as shown below:

Title page,
Item [57], ABSTRACT,
Line 8, "associate" should be -- associated --.
Line 11, after "fountain solution" and before "or", insert -- soluble --.
Line 13, delete "while solution".

Column 3,
Lines 40 and 57, "adhesive" should be -- abhesive --.

Column 19,
Line 48, "adhesive" should be -- abhesive --.

Column 20,
Line 42, "adhesive" should be -- abhesive --.

Column 21,
Line 63, "composing" should be -- comprising --.

Column 23,
Line 7, "The method of claim 30" should be -- The method of claim 32 --.
Line 9, "The method of claim 32" should be -- The method of claim 30 --.

Signed and Sealed this

Tenth Day of June, 2003

JAMES E. ROGAN
*Director of the United States Patent and Trademark Office*